(12) United States Patent
Blackwood

(10) Patent No.: US 7,023,225 B2
(45) Date of Patent: Apr. 4, 2006

(54) WAFER-MOUNTED MICRO-PROBING PLATFORM

(75) Inventor: Jeffrey Blackwood, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 229 days.

(21) Appl. No.: 10/417,049

(22) Filed: Apr. 16, 2003

(65) Prior Publication Data
US 2004/0207416 A1    Oct. 21, 2004

(51) Int. Cl.
G01R 31/02    (2006.01)
G01R 31/26    (2006.01)

(52) U.S. Cl. .................. 324/754; 324/758; 324/765

(58) Field of Classification Search ........ 324/754–765, 324/158.1
See application file for complete search history.

(56) References Cited

U.S. PATENT DOCUMENTS

| 4,266,191 | A | * | 5/1981 | Spano et al. | 324/758 |
| 4,623,839 | A | * | 11/1986 | Garretson et al. | 324/762 |
| 5,959,461 | A | * | 9/1999 | Brown et al. | 324/765 |
| 6,031,383 | A | * | 2/2000 | Streib et al. | 324/754 |
| 6,198,299 | B1 | * | 3/2001 | Hollman | 324/758 |
| 6,605,951 | B1 | * | 8/2003 | Cowan | 324/754 |

* cited by examiner

*Primary Examiner*—Paresh Patel
(74) *Attorney, Agent, or Firm*—Trexler, Bushnell, Giangiorgi and Blackstone Ltd.

(57) ABSTRACT

A method and apparatus for probing semiconductor circuits using a wafer-mounted micro-probing platform. A platform or platen is affixed to the surface of a wafer. Probe manipulators are mounted on the platen, and probes extend from or are otherwise associated with the probe manipulators. The probe manipulators may be fixed in position, or they may be motorized to allow adjustment of the probe positions while in-situ. During probing, electrical signals are preferably sent to the probes viz.-a-viz. feedthrough interfaces. The platen which is affixed to the surface of the wafer effectively serves two purposes: 1) as a mounting point for the probe manipulators; and 2) to mechanically stiffen the wafer so that the wafer does not flex, thereby requiring re-positioning of the probes.

20 Claims, 2 Drawing Sheets

WAFER-MOUNTED MICRO-PROBING PLATFORM

BACKGROUND

The present invention generally relates to methods and apparatuses for probing semiconductor circuits, and more specifically relates to a method and apparatus for probing semiconductor circuits using a wafer-mounted micro-probing platform.

Failure analysis, design debugging and process/device characterization of a semiconductor circuit is typically performed using probes. Specifically, probes are used to probe semiconductor circuits to gain electrical information about the circuit under test. Mechanical connection to the circuit is typically achieved using small metal probes. The probes are maneuvered into place with probe manipulators, which provide that the probes can be precisely positioned and oriented.

Existing mechanical probing technology uses a platform (i.e., platen) separated from the wafer to hold the probe manipulators and probes. This facilitates probing many die on the wafer by moving the wafer independent of the platen. The probes are positioned in the spatial arrangement required to contact the areas of interest. When moving from one die to the next, the probes are lifted (i.e., separated from the die), the wafer is spatially translated to the next die of interest, and the probes are lowered into contact with the die. Many die may be probed in this manner without having to stop and re-arrange the probe positions for each new die.

The main problem with the probing arrangement discussed above is the extra spatial requirements necessary to support and place the probe manipulators. Under normal probing situations, this is not an issue, as probing is conducted on a dedicated probe station. However, new process technology improvements are driving feature sizes smaller and smaller. The smaller the feature sizes become, the more difficult it is to physically contact them using a conventional probe station.

The advent of active and passive contrast and test/yield/quality vehicles designed for use with SEM/FIB-based contrast mechanisms is driving the need to be able to probe semiconductor circuits in the vacuum chamber. In other words, there is a need for an in-vacuum chamber probing solution. While there are several in-vacuum chamber probing systems which are presently commercially available (such as Schlumberger IDS systems), the systems which are available require retrofitting a vacuum chamber of a SEM/FIB, and are generally very expensive, low SEM resolution solutions.

Generally, the solutions which are commercially available or are widely used require either the use of a dedicated vacuum chamber (i.e., a vacuum chamber which is designed specifically for probing) or require retrofitting the vacuum chamber of the SEM/FIB to be used in conjunction with probing. Both approaches require a relatively significant cost in materials and tool downtime for setup and takedown of the probing system, during which time the tool is unavailable for other use. The approaches require significant capital investment in that a probe station must be purchased, a dedicated vacuum chamber/SEM must be purchased (if applicable), and probe manipulators must be purchased.

OBJECTS AND SUMMARY

An object of an embodiment of the present invention is to provide a method and apparatus for probing semiconductor circuits using a wafer-mounted micro-probing platform.

Another object of an embodiment of the present invention is to provide a method and apparatus for probing semiconductor circuits which allows probing with no extra spatial requirements.

Yet another object of an embodiment of the present invention is to provide a method and apparatus which provides an in-vacuum chamber probing solution which is not expensive.

Still another object of an embodiment of the present invention is to provide a method and apparatus which provides an in-vacuum chamber probing solution which can be used in a variety of chambers, such as existing SEM/FIB chambers, with little or no retrofitting necessary.

Still yet another object of an embodiment of the present invention is to provide a method and apparatus for probing semiconductor circuits using a wafer-mounted micro-probing platform, where the platform can be moved between various inspection/analysis tools without requiring many hours of tool setup time.

Briefly, and in accordance with at least one of the foregoing objects, an embodiment of the present invention provides a method and apparatus for probing semiconductor circuits using a wafer-mounted micro-probing platform. A platform or platen is affixed to the surface of a wafer. A hole is preferably provided in the platen, and the hole allows probing of circuitry of interest for several dies in any direction. Probe manipulators are mounted on the platen, generally around the hole, and probes extend from or are otherwise associated with the probe manipulators. The probe manipulators may be fixed in position, or they may be motorized to allow adjustment of the probe positions while in-situ. Preferably, the probe manipulators are relatively small, as this provides that the overall height of the platen and probe manipulators can be small, thereby allowing placement of the wafer and platen in various SEM/FIB tools. During probing, electrical signals are preferably sent to the probes viz.-a-viz. feedthrough interfaces, such as feedthrough interfaces which are conventional in presently available SEM/FIB systems. The platen which is affixed to the surface of the wafer effectively serves two purposes: 1) as a mounting point for the probe manipulators; and 2) to mechanically stiffen the wafer so that the wafer does not flex, thereby requiring re-positioning of the probes.

BRIEF DESCRIPTION OF THE DRAWINGS

The organization and manner of the structure and operation of the invention, together with further objects and advantages thereof, may best be understood by reference to the following description, taken in connection with the accompanying drawing, wherein.

DESCRIPTION

Figure 1:
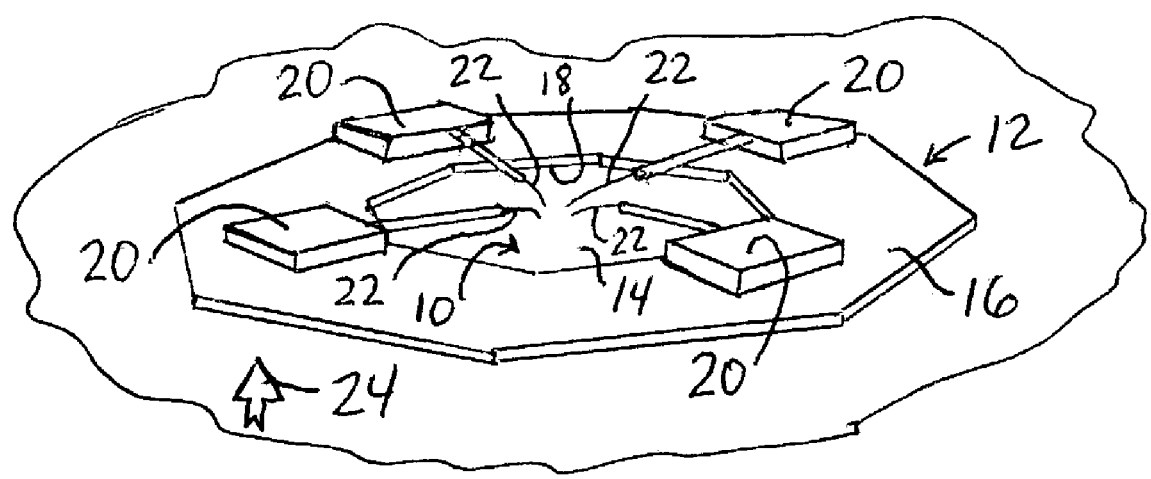
FIG. 1 is a perspective view of an apparatus for probing a semiconductor circuit, where the apparatus is in accordance with an embodiment of the present invention.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

FIG. 1 illustrates a wafer 10 and an apparatus 12 for probing a semiconductor circuit 14 on the wafer 10, where the apparatus 12 is in accordance with an embodiment of the present invention. The apparatus 12 provides that a semiconductor circuit can be probed using a wafer-mounted micro-probing platform, inexpensively, with no extra spatial requirements. The apparatus provides an in-vacuum chamber probing solution which can be used in a variety of chambers, such as existing SEM/FIB chambers, with little or no retrofitting necessary. The platform can be moved between various inspection/analysis tools without requiring many hours of tool setup time.

The apparatus 12 includes a small platform or platen 16 which is affixed to the surface of a wafer 10. As shown in FIG. 1, a hole 18 is preferably provided in the platen 16, and the hole 18 allows probing of circuitry of interest for several dies in any direction. Probe manipulators 20 are mounted on the platen 16, generally around the hole 18, and probes 22 extend from or are otherwise associated with the probe manipulators 20. The probe manipulators 20 may be fixed in position, or they may be motorized to allow adjustment of the probe positions while in-situ. Preferably, the probe manipulators 20 are relatively small, as this provides that the overall height of the platen 16 and probe manipulators 20 can be small, thereby allowing placement of the wafer 10 and platen 16 in various SEM/FIB tools. During probing, electrical signals (represented by arrow 24 in FIG. 1) are preferably sent to the probes 22 viz.-a-viz. feedthrough interfaces, such as feedthrough interfaces which are conventional in presently available SEM/FIB systems.

The platen 16 which is affixed to the surface of the wafer 10 effectively serves two purposes: 1) as a mounting point for the probe manipulators 20; and 2) to mechanically stiffen the wafer 10 so that the wafer 10 does not flex, thereby requiring re-positioning of the probes 22.

The apparatus 12 shown in FIG. 1 (i.e., the platen 16, probe manipulators 20 and probes 22) could be used as a stand-alone mechanical probing solution when only several die are intended to be analyzed. While many current probe stations have a footprint or size of several tens of square feet, and require significant facilitation for installation and use, the platen 16 shown in FIG. 1 preferably is small enough to be used on a desktop.

Figure 2:
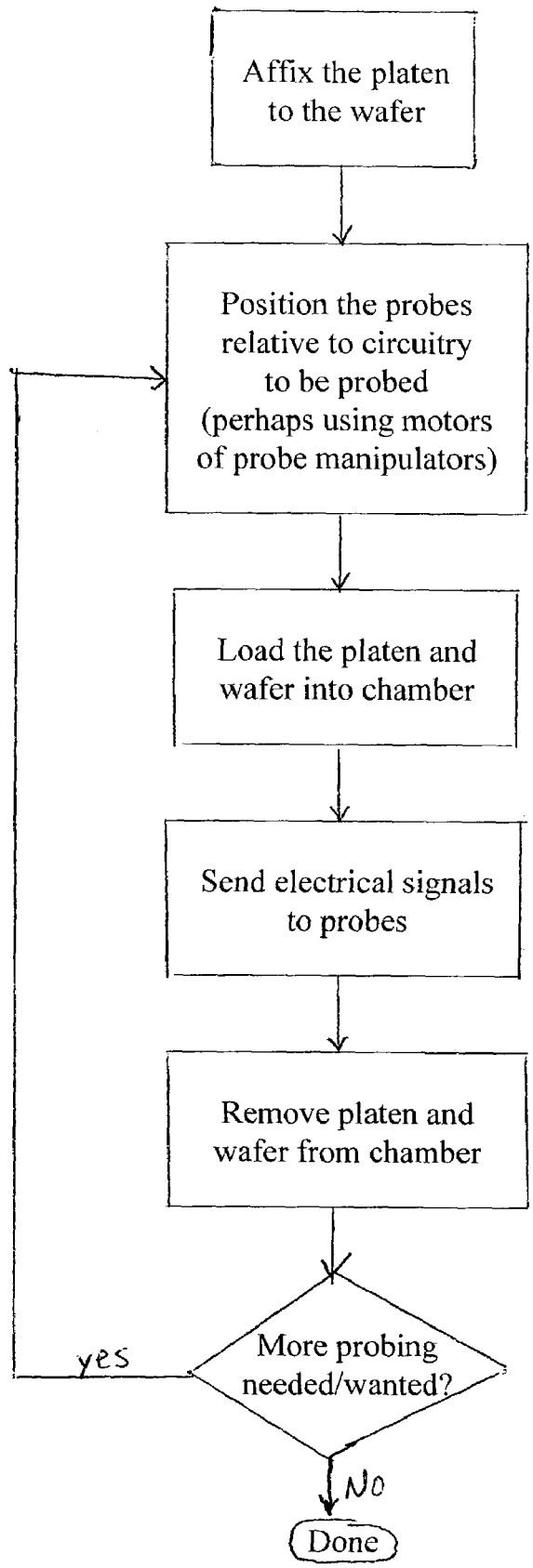
FIG. 2 is a block diagram which illustrates a method of probing a semiconductor circuit, where the method is in accordance with an embodiment of the present invention.

FIG. 2 illustrates a method which is in accordance with an embodiment of the present invention. The method involves the installation and use of a wafer-mounted micro-probing platform, such as the apparatus shown in FIG. 1. Hence, FIG. 2 will be explained with reference to FIG. 1. The method provides that the platform or platen 16 is affixed to the wafer 10, where the platen 16 preferably includes a hole 18, and carries or has mounted thereon probe manipulators 20 and probes 22. Once the platen 16 is affixed to the wafer 10, the probes 22 are placed in their desired positions, preferably while outside a vacuum chamber, while under a microscope. If the probe manipulators 20 are motorized, the motors are actuated to place the probes 22 in their desired positions. Then, the wafer 10 and platen 16 are loaded into a SEM/FIB chamber, such as into a conventional, existing SEM/FIB chamber. Then, electrical signals 24 are sent to the probes 22 to conduct probing of the circuitry of interest. Then, the platen 16 and wafer 10 may be removed from the chamber and the probes 22 re-positioned, under a microscope, to test other dies on the wafer 10. This process of removing the platen 16 and wafer 10 and re-positioning the probes 22 may be repeated to probe many die on the wafer 10.

As discussed above, a method and apparatus are provided for probing semiconductor circuits using a wafer-mounted micro-probing platform, inexpensively, with no extra spatial requirements. The method and apparatus provide an in-vacuum chamber probing solution which can be used in a variety of chambers, such as existing SEM/FIB chambers, with little or no retro-fitting necessary. The method and apparatus provide that the platform can be moved between various inspection/analysis tools without requiring many hours of tool setup time.

While an embodiment of the present invention is shown and described, it is envisioned that those skilled in the art may devise various modifications of the present invention without departing from the spirit and scope of the appended claims.

What is claimed is:

1. An apparatus for probing a semiconductor circuit on a wafer, said apparatus comprising: a platen configured for positioning on top of a surface of the wafer wherein the platen contacts the wafer; probe manipulators disposed on the platen; and probes, wherein there is a probe manipulator mechanically associated with each probe such that said probe manipulators are operable to position said probes during use of the apparatus to probe the semiconductor circuit while the platen is in contact with the wafer.

2. An apparatus as defined in claim 1, wherein said platen includes a hole.

3. An apparatus as defined in claim 2, wherein said probe manipulators are disposed generally around said hole.

4. An apparatus as defined in claim 1, wherein said probe manipulators are mounted on said platen.

5. An apparatus as defined in claim 1, wherein said probes extend from said probe manipulators.

6. An apparatus as defined in claim 1, wherein said probe manipulators are fixed in position.

7. An apparatus as defined in claim 1, wherein said probe manipulators are motorized.

8. In combination, a wafer and apparatus for probing a semiconductor circuit on the wafer, said apparatus comprising a platen configured for positioning on top of a surface of the wafer wherein the platen contacts the wafer, probe manipulators disposed on the platen, and probes, wherein there is a probe manipulator mechanically associated with each probe such that said probe manipulators are operable to position said probes during use of the apparatus to probe the semiconductor circuit while the platen is in contact with the wafer.

9. A combination as defined in claim 8, wherein said platen includes a hole.

10. A combination as defined in claim 9, wherein said probe manipulators are disposed generally around said hole.

11. A combination as defined in claim 8, wherein said probe manipulators are mounted on said platen.

12. A combination as defined in claim 8, wherein said probes extend from said probe manipulators.

13. A combination as defined in claim 8, wherein said probe manipulators are fixed in position.

14. A combination as defined in claim 8, wherein said probe manipulators are motorized.

15. A method of probing a semiconductor circuit on a wafer, said method comprising: providing an apparatus for probing a semiconductor circuit on a wafer, said apparatus comprising a platen configured for positioning on top of a surface of the wafer wherein the platen contacts the wafer, probe manipulators disposed on the platen, and probes, wherein there is a probe manipulator mechanically associated with each probe such that said probe manipulators are operable to position said probes during use of the apparatus to probe the semiconductor circuit; positioning the platen on top of a surface of the wafer; using the probe manipulators on the platen to position the probes relative to the semiconductor circuit; and sending electrical signals to the probes to probe the semiconductor circuit while the platen is in contact with the wafer.

16. A method as recited in claim 15, further comprising using motorized probe manipulators to position the probes.

17. A method as recited in claim 15, further comprising loading the wafer and platen into a chamber and sending the electrical signals to the probes while the wafer and platen are in the chamber.

18. A method as recited in claim 17, further comprising removing the wafer and platen from the chamber, re-positioning the probes, re-loading the wafer and plater into the chamber and sending more electrical signals to the probes while the wafer and platen are in the chamber.

19. A method of probing a semiconductor circuit on a wafer, said method comprising: affixing a platen to the wafer; using probe manipulators on the platen to position probes relative to the semiconductor circuit; sending electrical signals to the probes to probe the semiconductor circuit; loading the wafer and platen into a chamber and sending the electrical signals to the probes while the wafer and platen are in the chamber; removing the wafer and platen from the chamber; re-positioning the probes; re-loading the wafer and platen into the chamber; and sending more electrical signals to the probes while the wafer and platen are in the chamber.

20. A method as recited in claim 19, further comprising using motorized probe manipulators to position the probes.

* * * * *